United States Patent
Tsuchi

(10) Patent No.: US 8,390,609 B2
(45) Date of Patent: Mar. 5, 2013

(54) DIFFERENTIAL AMPLIFIER AND DRIVE CIRCUIT OF DISPLAY DEVICE USING THE SAME

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1030 days.

(21) Appl. No.: 12/382,170

(22) Filed: Mar. 10, 2009

(65) Prior Publication Data

US 2009/0231319 A1    Sep. 17, 2009

(30) Foreign Application Priority Data

Mar. 11, 2008 (JP) ................................. 2008-061781

(51) Int. Cl.
G09G 5/00 (2006.01)

(52) U.S. Cl. ......... 345/211; 345/204; 330/253; 330/255

(58) Field of Classification Search .................. None
See application file for complete search history.

(56) References Cited

U.S. PATENT DOCUMENTS

| | | | |
|---|---|---|---|
| 4,570,128 A | | 2/1986 | Monticelli |
| 5,471,171 A | * | 11/1995 | Itakura et al. .................. 330/253 |
| 6,714,076 B1 | * | 3/2004 | Kalb .............. 330/255 |
| 7,170,351 B2 | | 1/2007 | Shimatani |
| 2001/0028273 A1 | * | 10/2001 | Minamizaki et al. ......... 330/255 |
| 2005/0040889 A1 | * | 2/2005 | Tsuchi ........................ 330/255 |
| 2005/0068105 A1 | | 3/2005 | Shimatani |
| 2006/0226877 A1 | | 10/2006 | Nishimura et al. |

FOREIGN PATENT DOCUMENTS

| | | |
|---|---|---|
| CN | 1607564 A | 4/2005 |
| JP | 61-35004 A | 2/1986 |
| JP | 6-91379 | 11/1994 |
| JP | 2004-007744 A | 1/2004 |
| JP | 2004-7744 A | 1/2004 |
| JP | 2005-124120 | 5/2005 |
| JP | 2006-295365 A | 10/2006 |

OTHER PUBLICATIONS

Ground for Rejection dated Aug. 2, 2011, with English translation.
Chinese Office Action dated Aug. 3, 2012 with Partial English Translation.

* cited by examiner

*Primary Examiner* — Lixi C Simpson
(74) *Attorney, Agent, or Firm* — McGinn IP Law Group, PLLC

(57) ABSTRACT

Disclosed is a differential amplifier of the present invention includes a differential pair differentially receiving a signal, a current source connected between a first voltage supply and the differential pair, for driving the differential pair, a current-to-voltage converter circuit receiving output currents of the differential pair and producing first and second voltage signals, first and second transistors of mutually different conductivity types connected in series between the first voltage supply and a second voltage supply and respectively receiving the first and second voltage signals at control terminals thereof, a third transistor connected between the second voltage supply and an output terminal and receiving the first voltage signal at a control terminal thereof, and a fourth transistor of the same conductivity type as that of the third transistor, the fourth transistor being connected between the output terminal and the first voltage supply and having a control terminal thereof connected to a connecting node between the first and second transistors.

12 Claims, 10 Drawing Sheets

COMPARATIVE EXAMPLE
<OUTPUT STAGE OF CMOS CONFIGURATION>

COMPARATIVE EXAMPLE
<OUTPUT STAGE OF SAME CONDUCTIVITY TYPE (PMOS) CONFIGURATION>

FIG. 6 REFERENCE CASE

FIG. 8 REFERENCE CASE

DIFFERENTIAL AMPLIFIER AND DRIVE CIRCUIT OF DISPLAY DEVICE USING THE SAME

FIELD OF THE INVENTION

Reference to Related Application

This application is based upon and claims the benefit of the priority of Japanese patent application No. 2008-061781 filed on Mar. 11, 2008, the disclosure of which is incorporated herein in its entirety by reference thereto.

The present invention relates to a differential amplifier and a drive circuit of a display device using the differential amplifier.

BACKGROUND ART

In recent years, a demand for liquid crystal display devices for use in large-screen liquid crystal TV sets as well as for use in portable telephones (such as mobile phones or cellular phones), notebook PCs, and monitors has expanded. As these liquid crystal display devices, the liquid crystal display devices with an active matrix driving system that enables high-resolution display are used. First, a typical configuration of the liquid crystal display device with the active matrix driving system will be outlined with reference to FIG. 6. In FIG. 6, a main configuration connected to one pixel in a liquid crystal display unit is schematically shown in the form of an equivalent circuit.

Generally, a display unit 960 of the liquid crystal display device with the active matrix driving system is constituted from a semiconductor substrate, an opposed substrate, and a structure with liquid crystals sealed therein between these opposed two substrates. In the semiconductor substrate, transparent pixel electrodes 964 and thin-film transistors (TFTs) 963 (in the case of a color SXGA panel, for example, 1280×3 pixel rows×1024 pixel columns) are arranged in a matrix form. On the entire surface of the opposed substrate, one transparent electrode 967 is formed.

Turning on/off of a TFT 963 having a switching function is controlled by a scan signal. When the TFT 963 is turned on, a gray scale voltage corresponding to a video data signal is applied to a pixel electrode 964. The transmissivity of a liquid crystal changes due to a difference in potential between each of the pixel electrodes 964 and the opposing substrate electrode 967. Even after the TFT 963 has been turned off, the difference in potential is held at a liquid crystal capacitance 965 and an auxiliary capacitance 966 for a certain period, thereby displaying an image.

On the semiconductor substrate, data lines 962 that send a plurality of levels of voltage (gray scale voltages) applied to the respective pixel electrodes 964 and scan lines 961 that send scan signals are arranged in a matrix form (in the case of the color SXGA panel, 1280×3 data lines and 1024 scan lines are arranged). The scan lines 961 and the data lines 962 become large capacitive loads due to capacitances generated at mutual intersections and liquid crystal capacitances sandwiched with the opposing substrate electrode.

The scan signal is supplied to a scan line 961 by a gate driver 970, and supply of the gray scale voltage to each of the pixel electrodes 964 is performed from a data driver 980 through a data line 962. The gate driver 970 and the data driver 980 are controlled by a display controller 950. A clock CLK, a control signal, and the like are supplied to each of the gate driver 970 and the data driver 980 from the display controller 950. Video data is supplied to the data driver 980. Currently, digital data has become mainstream, as the video data. A supply voltage is supplied to each of the gate driver 970 and the data driver 980 from a supply voltage circuit 940.

Rewriting of data for one screen is performed in one frame period (usually, approximately 0.017 seconds), and each pixel row (each line) is selected one by one for each scan line. The gray scale voltage signal is supplied from each data line within the period of the selection.

While the gate driver 970 should supply at least a binary scan signal, the data driver 980 needs to drive the data line by the gray scale voltage signal of multi-valued levels corresponding to the number of gray scales. For this reason, the data driver 980 includes a decoder that converts the video data to an analog voltage and a digital-to-analog converter circuit (DAC) formed of an operational amplifier that amplifies the analog voltage and outputs the amplified analog voltage to a corresponding data line 962.

As a technique of driving a large-screen display device of the liquid crystal TV sets, a dot inversion driving scheme capable of realizing higher picture quality is adopted. In the dot inversion driving scheme, an opposing substrate electrode voltage VCOM is set to a constant voltage and voltage polarities held in adjacent pixels are mutually opposite in the display panel 960 in FIG. 6. For this reason, polarities of voltages output to the adjacent data lines 962 become positive-polarity and negative-polarity with respect to the opposing substrate electrode voltage VCOM. Since the data driver 980 in the dot inversion driving scheme must output positive-polarity and negative-polarity gray scale signal voltages, at least two voltage supplies having a potential difference which is approximately twice of the maximum value of a liquid crystal application voltage (that is a potential difference between a gray scale voltage and the opposing substrate electrode voltage) are supplied to the output amplifier of the data driver.

FIG. 7 is a diagram showing an example of a typical configuration of an output circuit for two outputs (formed of a positive-polarity output buffer amplifier, a negative-polarity output buffer amplifier, and an output switch circuit) in a data driver that performs dot inversion driving. In FIG. 7, two adjacent data lines (data line loads) 962-1 and 962-2 are respectively connected to driver output terminals P1 and P2. As shown in FIG. 7, this output circuit includes a positive-polarity output buffer amplifier (also simply abbreviated as a "positive-polarity amplifier") 91, a negative-polarity output buffer amplifier (also simply referred to as a "negative-polarity amplifier") 92, and an output switch circuit 300. A high-potential voltage supply VDD and a low-potential voltage supply VSS are supplied to the positive-polarity output buffer amplifier 91. Based on a positive-polarity reference voltage Vp, the positive-polarity output buffer amplifier 91 amplifies and outputs a positive gray scale voltage Vout1 to an amplifier output terminal N11. The high-potential voltage supply VDD and the low-potential voltage supply VSS are supplied to the negative-polarity output buffer amplifier 92. Based on a negative-polarity reference voltage Vn, the negative-polarity output buffer amplifier 92 amplifies and outputs a negative gray scale voltage Vout2 to an amplifier output terminal N12. The opposing substrate electrode voltage is set to be substantially intermediate between voltages of the high-potential voltage supply voltage VDD and the low-potential voltage supply voltage VSS.

The output switch circuit 300 includes switches SW11 and SW12, and switches SW21 and SW22. The switches SW11 and SW12 are respectively connected between the amplifier output terminal N11 and the driver output terminal P1 and between the amplifier output terminal N11 and the driver output terminal P2, and are respectively controlled by control signals S1 and S2. The switches SW21 and SW22 are respectively connected between the amplifier output terminal N12 and the driver output terminal P1 and between the amplifier output terminal N12 and the driver output terminal P2, and are respectively controlled on or off by the control signals S2 and S1. When the switches SW11 and SW22 to be controlled by the control signal S1 are turned on, the amplifier output terminals N11 and N12 are respectively connected to the driver output terminals P1 and P2. To the driver output terminals P1 and P2, the output voltage Vout1 of the positive-polarity output buffer amplifier 91 and the output voltage Vout2 of the negative-polarity output buffer amplifier 92 are respectively delivered.

When the switches SW12 and SW21 to be controlled by the control signal S2 are turned on, the amplifier output terminals N11 and N12 are respectively connected to the driver output terminals P2 and P1. Then, the output voltage Vout1 of the positive-polarity output buffer amplifier 91 and the output voltage Vout2 of the negative-polarity output buffer amplifier 92 are output to the driver output terminals P2 and P1, respectively.

In the configuration in FIG. 7, for respective polarities of signal voltages, the positive-polarity output buffer amplifier 91 and the negative-polarity output buffer amplifier 92 are provided. Connection to either the data line load 962-1 or the data line load 962-2 is switched by the output switch circuit 300, thereby performing polarity inversion driving. A differential input pair of each of the positive-polarity output buffer amplifier 91 and the negative-polarity output buffer amplifier 92 can be thereby composed by only N-channel transistors or P-channel transistors of a single conductivity type. An amplifier circuit configuration is thereby simplified, and an output deviation is thereby made uniform. In a Rail-to-Rail configuration with differential input pairs composed by both N-channel and P-channel transistor pairs, however, the output deviation deteriorates in the vicinity of power supply voltages.

In the dot inversion driving scheme in recent years, in order to reduce power dissipation due to a problem of heat generation in LSIs and a demand for energy saving, a driving scheme in which only N voltage polarities of a pixel sequence in a data line direction are set to be the same (for polarity inversion driving for each N horizontal periods) is being carried out. In this case, voltage polarities of adjacent data lines are mutually opposite. However, the N voltage polarities to be output to a same data line are the same.

In the polarity inversion driving scheme for each horizontal period (1H dot inversion), a positive-polarity gray scale voltage signal and a negative-polarity gray scale voltage signal are alternately output to a same data line. Thus, when the positive-polarity gray scale voltage signal is output, a charging operation is always performed. When the negative-polarity gray scale voltage signal is output, a discharging operation is always performed.

In the polarity inversion driving scheme for each N horizontal periods (NH dot inversion), N gray scale signals of a same polarity are output to a same data line. Even when the positive-polarity gray scale signals are output, the discharging operation is needed. Even when the negative-polarity gray scale voltage signals are output, the charging operation is needed. That is, each of the positive-polarity output amplifier 91 and the negative-polarity output amplifier 92 needs both of sufficient charging and discharging capabilities.

FIG. 8 is an output waveform diagram that explains an operation of the data driver in FIG. 7. In the 1H dot inversion, as shown in (a) of FIG. 8, the charging operation of the positive-polarity output buffer amplifier 91 and the discharging operation of the negative-polarity output buffer amplifier 92 are principally performed. For charge driving by the positive-polarity output buffer amplifier 91 and discharge driving by the negative-polarity output buffer amplifier 92, high driving capability is needed. A discharging operation of the positive-polarity output buffer amplifier 91 and a charging operation of the negative-polarity output buffer amplifier 92 only serve to prevent overshooting and undershooting, and hence high driving capability is not needed for the discharging operation of the positive-polarity output buffer amplifier 91 and the charging operation of the negative-polarity output buffer amplifier 92.

In 2 H dot inversion, as shown in (b) of FIG. 8, high driving capability of a certain degree is needed for the discharging operation of the positive-polarity output buffer amplifier 91 and the charging operation of the negative-polarity output buffer amplifier 92 as well as the charging operation of the positive-polarity output buffer amplifier 91 and the discharging operation of the negative-polarity output buffer amplifier 92.

FIG. 9 is a diagram showing an example of a typical configuration (related art) of the positive-polarity output buffer amplifier 91 in FIG. 7, and shows the configuration in which an output stage is formed of transistors of a same polarity. Referring to FIG. 9, a differential stage (input differential stage) includes a current source M90 which has a first terminal connected to a power supply terminal (VSS), N-channel transistors M91 and M92, a P-channel transistor M93 which has a source connected to a power supply terminal (VDD) and a drain connected to a drain of the N-channel transistor M91, and a diode-connected (gate and drain being coupled) P-channel transistor M94 which has a source connected to the power supply terminal (VDD), a gate connected to a gate of the P-channel transistor M93, and a connected to a drain of the N-channel transistor M92. Coupled sources of the N-channel transistors M91 and M92 are connected to a second terminal of the current source M90. Gates of the N-channel transistors M91 and M92 receive an input voltage Vin and a output voltage Vout which is fed backed, respectively.

An intermediate stage includes a P-channel transistor M95 which has a source connected to the power supply terminal (VDD) and a gate connected to an output node (drain of the transistor M91) of the differential stage, and a current source M96 connected between a drain of the P-channel transistor M95 and the power supply terminal (VSS).

An output stage includes a P-channel transistor M97 which has a source connected to the power supply (VDD) and a gate connected to the output node (drain of the transistor M91) of the differential stage and a P-channel transistor M98 which has a drain connected to the power supply terminal (VSS), a gate connected to the drain of the P-channel transistor M95, and a source connected to a drain of the P-channel transistor M97. A connection node of the drain of the P-channel transistor M97 and the source of the P-channel transistor M98 is an output terminal of the positive-polarity output buffer amplifier 91.

The configuration of the differential amplifier shown in FIG. 9 is simple and area saving. The P-channel transistor M98 in the output stage is of a source follower connection, and a short circuit current at a time of high-speed charging is small. However, there is a problem as a buffer amplifier that drives a large-screen liquid crystal display device. A description will be given about the problem below.

When a data line with a large capacitive load is driven with a high slew rate, the size (channel width) of each of the P-channel transistors M97 and M98 in the output stage is set to be sufficiently large. For this reason, when current of the current source 96 is small, a gate potential at the P-channel transistor M98 cannot be quickly changed due to a gate parasitic capacitance of the P-channel transistor M98. That is, the problem of a shortage of discharging capability of the positive-polarity output buffer amplifier arises. Then, in order to increase the discharging capability of the P-channel transistor M98, it is necessary to increase static current dissipation of the current source M96. Power dissipation will be thereby increased.

As described above, the discharging capability of the positive-polarity output amplifier 91 in FIG. 9 is defined by the current value of the current source M96. Thus, when low power dissipation is to be implemented, the discharging capability is usually reduced (which also holds true for charging capability of the negative-polarity output amplifier 92). On the other hand, in order to increase the discharging capability of the positive-polarity output amplifier 91, a current value of the current source 96 should be increased. However, a problem may arise that static power dissipation of each amplifier is increased (which also holds true for the charging capability of the negative-polarity output amplifier 92).

As a configuration of an amplifier in which static power dissipation of the amplifier is comparatively small and discharging capability of the positive-polarity output amplifier 91 is high, an AB-class output circuit disclosed in Patent Document 1 listed below is known. FIG. 10 is a diagram showing a configuration of the AB-class output circuit in Patent Document 1 listed below. Referring to FIG. 10, an output stage includes a P-channel transistor M87 connected between a high-potential power supply terminal (VDD) and an output terminal ND1 and an N-channel transistor M88 connected between the output terminal ND1 and a low-potential power supply terminal (VSS). The output stage drives the output terminal ND1 with high charging capability and with high discharging capability. A gate node NP1 of the P-channel transistor M87 is connected to an output of a driver 70 that receives an input signal Vin. The P-channel transistor M87 performs a charging operation. A change in the input signal Vin is transmitted to a gate node NN1 of the N-channel transistor M88 through an intermediate stage (formed of current sources M83 and M84). The N-channel transistor M88 performs a discharging operation. The intermediate stage includes a P-channel floating current source M83 and N-channel floating current source M84, and current sources M81 and M82. Bias voltages BP2 and BN2 are supplied to gates of the P-channel floating current source M83 and the N-channel floating current source M84, respectively. The P-channel floating current source M83 and the N-channel floating current source M84 are connected between the gate node NP1 of the transistor M87 and the gate node NN1 of the transistor M88. The current source M81 is connected between the high-potential power supply VDD and the gate node NP1 of the P-channel transistor M87. The current source M82 is connected between the low-potential power supply VSS and the gate node NN1 of the N-channel transistor M88. A sum of currents of the floating current sources 83 and M84 is set to be substantially equal to current of each of the current sources M81 and M82.

When the terminal NP1 is changed to a lower potential in response to the input voltage Vin, the P-channel transistor M87 performs the charging operation. In this case, the current of the N-channel floating current source M84 is not changed, but the current of the P-channel floating current source M83 is reduced. Thus, the node NN1 is changed to a low potential, so that the discharging operation of the N-channel transistor M88 is stopped. Accordingly, the AB-class output circuit in FIG. 10 can perform a charging operation at high speed.

On the other hand, when the node (terminal) NP1 is changed to a higher potential in response to the input voltage Vin, the charging operation of the P-channel transistor M87 is stopped. In this case, the current of the N-channel floating current source M84 is not changed, but the current of the P-channel floating current source M83 is abruptly changed. Thus, the terminal NN1 is quickly changed to a higher potential, so that the N-channel transistor M88 performs the discharging operation. Accordingly, the AB-class output circuit in FIG. 10 can perform a discharging operation at high speed. When a relationship among the sum of the currents of the floating current sources M83 and M84, the current of the current source M83, and the current of the current source M84 is maintained, a static current dissipation value of each of the current sources M83 and M84 can be sufficiently reduced. Based on Patent Document 2 listed below that cites Patent Document 1 therein, the driver 70 can be formed of an N-channel differential pair. In this case, the driver in FIG. 10 can be replaced by the positive-polarity output amplifier 91 in FIG. 7.

Alternatively, by connecting an output terminal of the driver 70 to the node (terminal) NN1 and further by forming the driver 70 of a P-channel differential pair, the driver in FIG. 10 can also be replaced by the negative-polarity output amplifier 92 in FIG. 7.

[Patent Document 1] JP Patent Kokoku Publication No. JP-B-6-91379 (FIG. 1)

[Patent Document 2] JP Patent Kokai Publication No. JP-P2005-124120A (FIG. 1)

SUMMARY

The entire disclosures of Patent Documents 1 and 2 are incorporated herein by reference thereto. The following analyses are given by the present invention.

In the circuit shown in FIG. 9, when nH inversion driving (in which n is an integer not less than two) is performed, the discharging capability of the positive-polarity amplifier and the charging capability of the negative-polarity amplifier become insufficient. When this insufficiency is to be improved, current of the intermediate stage must be increased. Power dissipation will be thereby increased.

The configuration of the circuit shown in FIG. 10 is comparatively simple and is also area saving. The circuit is the AB-class output circuit in which the charging and discharging elements in the output stage are composed of the P-channel and N-channel transistors (of a CMOS configuration). Idling current in the intermediate stage is reduced to be small. High-speed charging/discharging can be thereby performed. Thus, the circuit in FIG. 10 can be applied to the positive-polarity output buffer 91 in FIG. 7. However, the output stage of the circuit shown in FIG. 10 is of the CMOS configuration. Thus, a short circuit current is generated by large amplitude driving at a time of polarity inversion. Power dissipation will be thereby increased. A mechanism of generation of the short circuit current will be described later, with reference to FIG. 4A.

Accordingly, an object of the present invention is to provide a differential amplifier and a data driver that implement high-speed operation with low power dissipation even when nH inversion driving is performed.

The invention, which seeks to solve one or more of the above described problems, is summarized as follows.

According to one aspect of the present invention, there is provided a differential amplifier including:

a differential pair that differentially receives signals;

a current source that is connected between a first power supply terminal and the differential pair and supplies current to the differential pair;

a current-to-voltage converter circuit that outputs first and second voltage signals according to output currents of the differential pair, the potentials of the first and second voltage signals produced by the current-to-voltage converter circuit changing in the same direction between a first power supply potential and a second power supply potential;

a first transistor of a first conductivity type and a second transistor of a second conductivity type connected in series between the first power supply terminal and a second power supply terminal, the first and second transistors respectively receiving the first and second voltage signals at control terminals thereof;

a third transistor of the first conductivity type that is connected between the second power supply terminal and an output terminal and receives the first voltage signal at a control terminal thereof; and a fourth transistor of the first conductivity type that is connected between the output terminal and the first power supply terminal, a control terminal of the fourth transistor being connected to a connection node of the first and second transistors.

In the present invention, the current-to-voltage converter circuit includes: a load circuit connected between an output pair of the differential pair and the second power supply terminal;

a second current source connected between the second power supply terminal and a connection node at which one output of the differential pair, the control terminal of the first transistor, and the control terminal of the third transistor are connected in common;

a third current source connected between the first power supply terminal and the control terminal of the second transistor; and fifth and sixth transistors of the first and second conductivity types connected in parallel between the control terminal of the first transistor and the control terminal of the second transistor, the fifth and sixth transistors having control terminals supplied with predetermined bias voltages, respectively. The first voltage signal is a voltage signal at a connection node of the control terminal of the first transistor and the second current source, and the second voltage signal is a voltage signal at a connection node of the control terminal of the second transistor and the third current source.

According to the present invention, a data driver of a display device including the differential amplifier of the present invention is provided.

According to the present invention, a differential amplifier and a data driver that implement nH inversion driving at a high speed operation, with low power dissipation, can be provided.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 4A and 4B are diagrams explaining operations at a time of charging at high speed, in which FIG. 4A shows an output stage of a CMOS configuration, and FIG. 4B shows an output stage of a same conductivity type;

PREFERRED MODES

Figure 1:
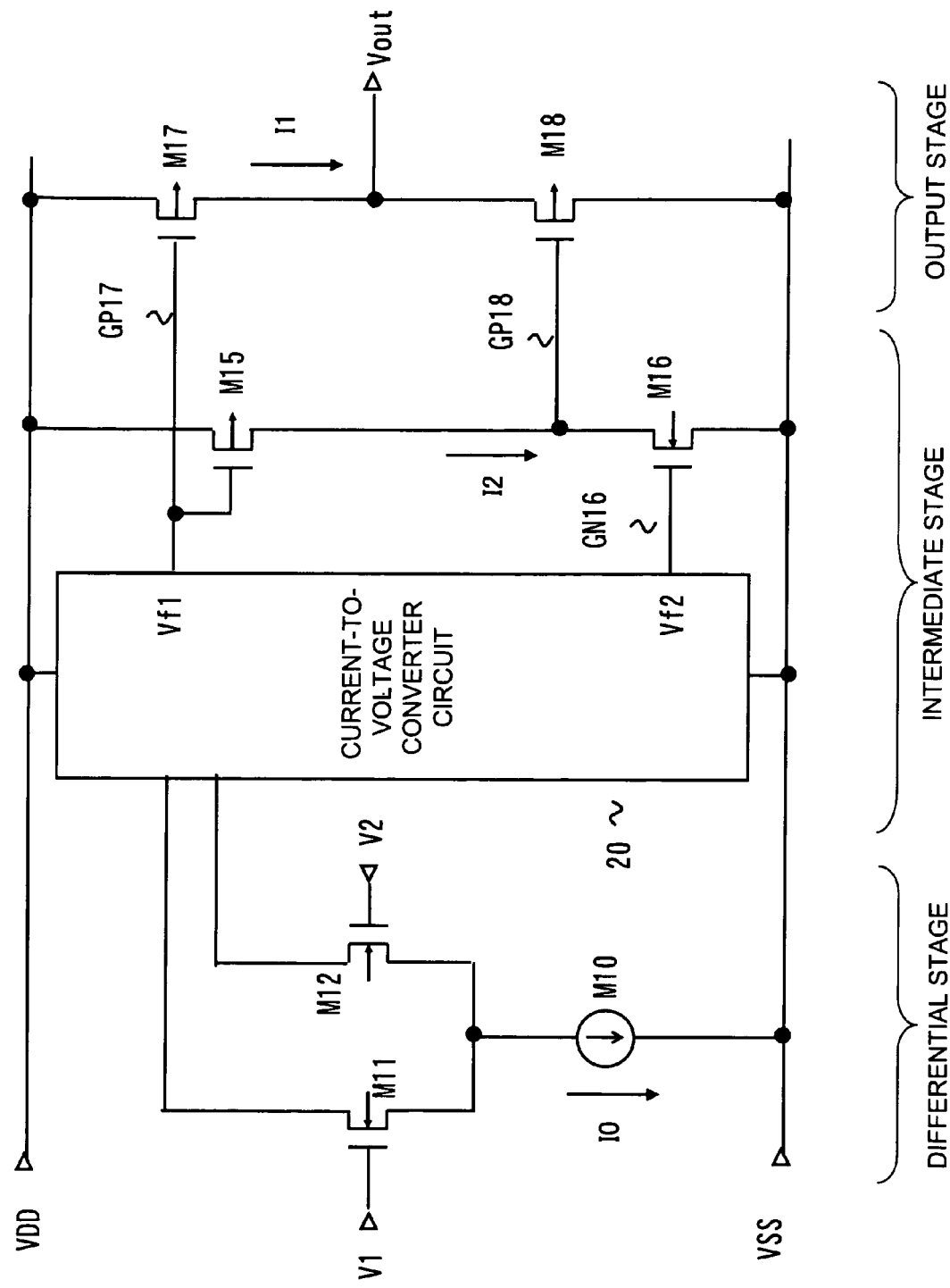
FIG. 1 is a diagram showing a configuration of a positive-polarity amplifier in an exemplary embodiment of the present invention.
Figure 7:
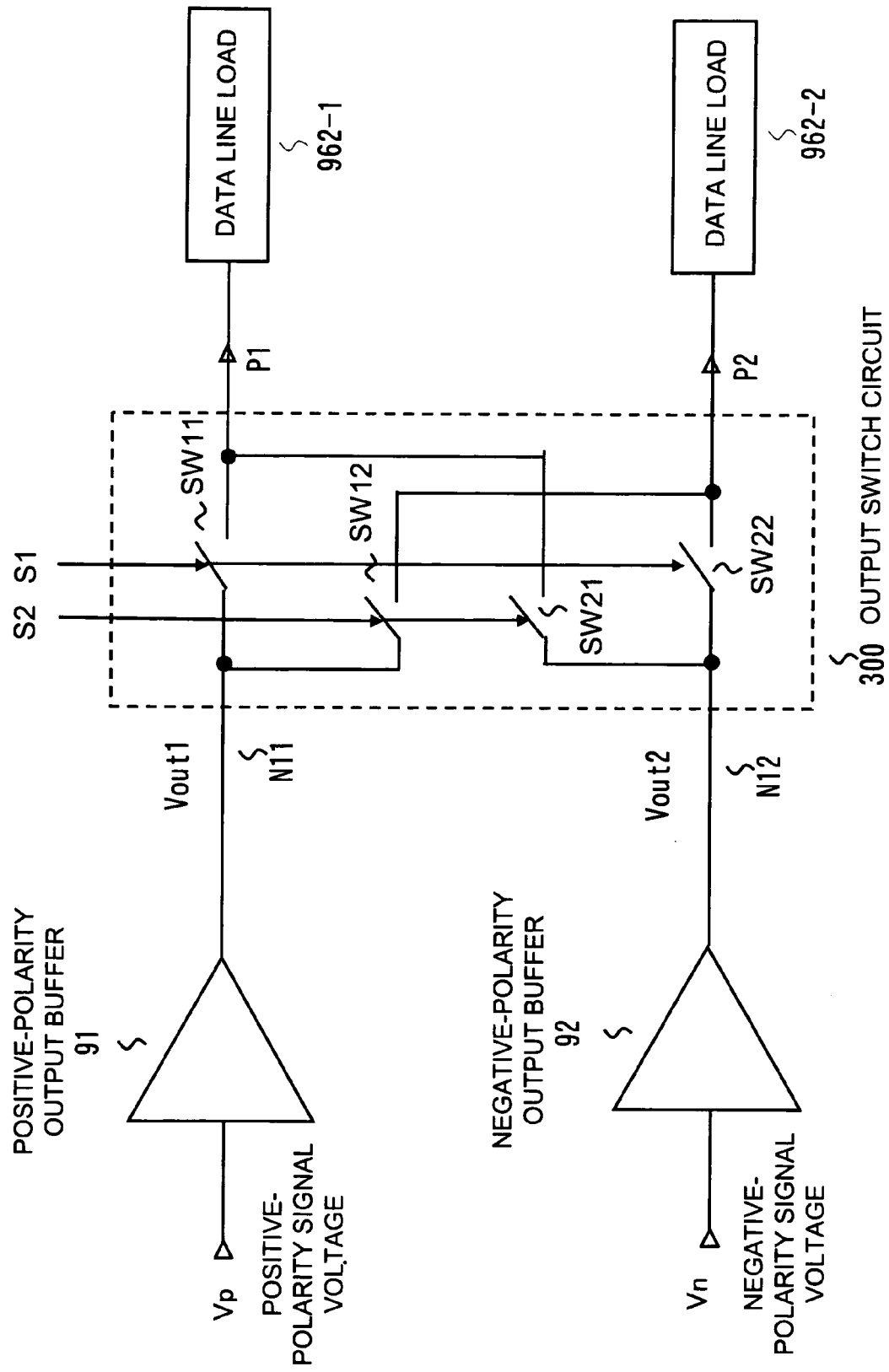
FIG. 7 is a diagram showing a configuration of an output circuit.
Figure 8:
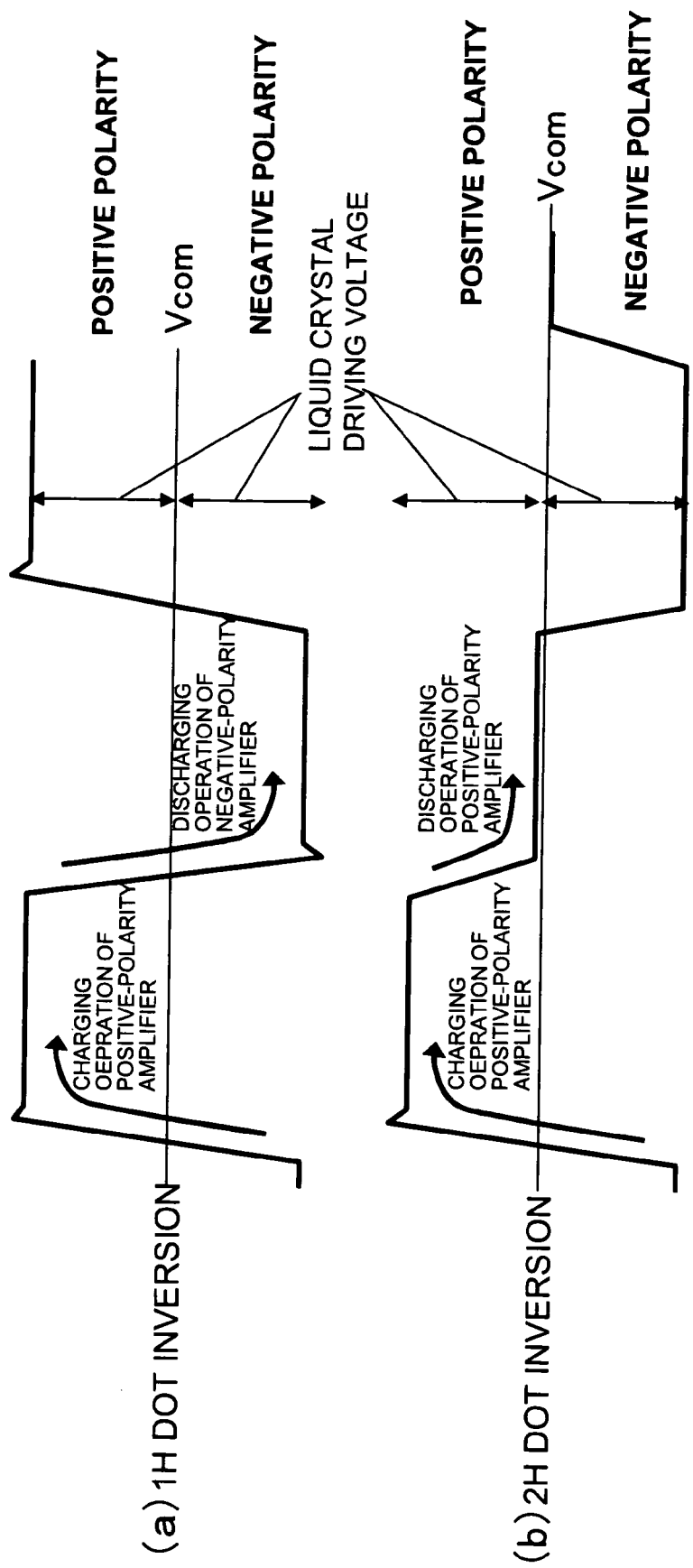
FIG. 8 is diagram showing output waveforms of a data driver, in which (a) indicates 1H dot inversion, and (b) shows 2H dot inversion.
Figure 9:
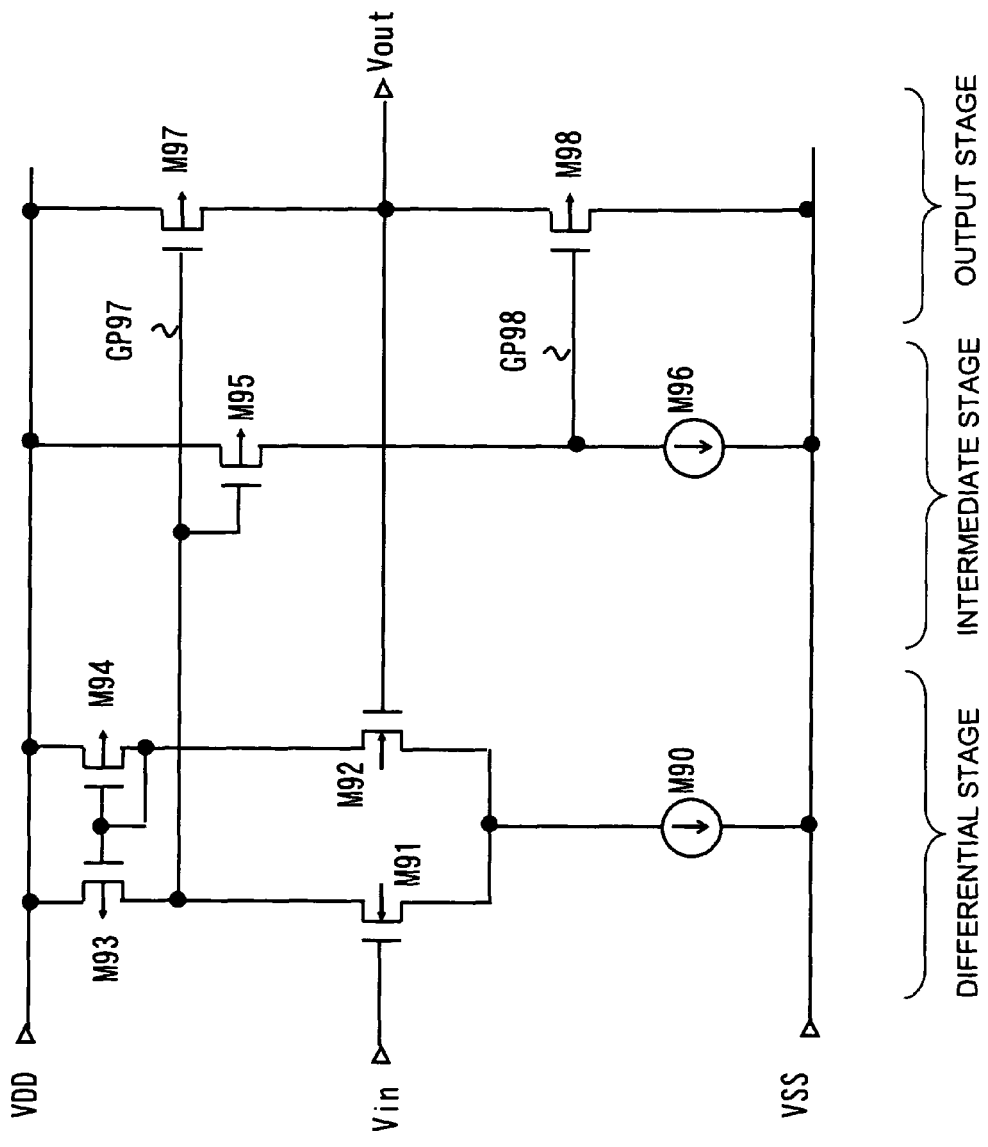
FIG. 9 is a diagram showing a configuration of a positive-polarity amplifier (with an output stage of the same conductivity type) of a related art.

In order to describe the present invention described above in further detail, a description will be given with reference to appended drawings. FIG. 1 is a diagram showing a configuration of a first exemplary embodiment of the present invention. FIG. 1 shows a configuration of a differential amplifier used as a positive-polarity output buffer amplifier in FIG. 7.

Referring to FIG. 1, the differential amplifier includes:

a current source M10 which has one end connected to a terminal of a first power supply (VSS) constituted from a low-potential voltage supply;

NMOS transistors M11 and M12 which have coupled sources connected to the other end of the current source M10, MOS transistors M11 and M12 constituting a differential pair that differentially receive input signal voltages (V1, V2);

a current-to-voltage converter circuit 20 which is connected to outputs (drains) of the differential pair formed of the NMOS transistors M11 and M12, and performs current-to-voltage conversion of the output currents to output a first voltage (Vf1) and a second voltage (Vf2);

a PMOS transistor M15 which as a source connected to a terminal of a second power supply (VDD) constituted from a high-potential voltage supply and a gate connected to an output of the first voltage (Vf1) of the current-to-voltage converter circuit 20;

an NMOS transistor M16 which has a source connected to the first power supply terminal (VSS), a gate connected to an output of the second voltage (Vf2) of the current-to-voltage converter circuit 20, and a drain connected to a drain of the PMOS transistor M15;

a PMOS transistor M17 (charging element) which has a source connected to the second power supply terminal (VDD), a gate (node GP17) connected to the output of the first voltage (Vf1) of the current-to-voltage converter circuit 20; and a PMOS transistor M18 (discharging element) which has a drain thereof connected to the first power supply terminal (VSS), a gate (node GP18) connected to the drain of the NMOS transistor M16, and a source connected to a drain of the PMOS transistor M17.

The potentials of the first and second voltage signals (Vf1, Vf2) produced by the current-to-voltage converter circuit 20 change in the same direction between the first power supply potential and the second power power supply potential.

In this exemplary embodiment, the charging and discharging elements in an output stage are composed of the PMOS transistors M17 and M18 of the same conductivity type. The gate (node GP18) of the PMOS transistor M18 is driven by the transistors M15 and M16 of a CMOS configuration in an intermediate stage.

Even when idling current (static current dissipation) that flows through each of the transistors M15 and M16 of the CMOS configuration in the intermediate stage is set to be sufficiently small, a gate potential at the transistor M18 is quickly increased by the PMOS transistor M15 at a time of charging. At a time of discharging, the gate potential at the transistor M18 is quickly reduced by the NMOS transistor M16. High-speed charging and discharging operations can be thereby performed.

Since the output stage is formed of the PMOS transistors, no short circuit current is generated even at a time of driving an output Vout from a negative polarity to a positive polarity to achieve the maximum amplitude. At a time of a discharge driving operation of the positive-polarity amplifier in nH driving, the output has a small amplitude (½ of VDD−VSS at the maximum). Thus, a short circuit current is limited to be small.

The potential at the node GP18 is also changed at high speed like an output voltage change. However, transistor sizes of the transistors M15 and M16 are set to be sufficiently smaller than those of the PMOS transistors M17 and M18 in the output stage that drive a load. Accordingly, a short circuit current in the CMOS transistors M15 and M16 is limited to be small.

Figure 10:
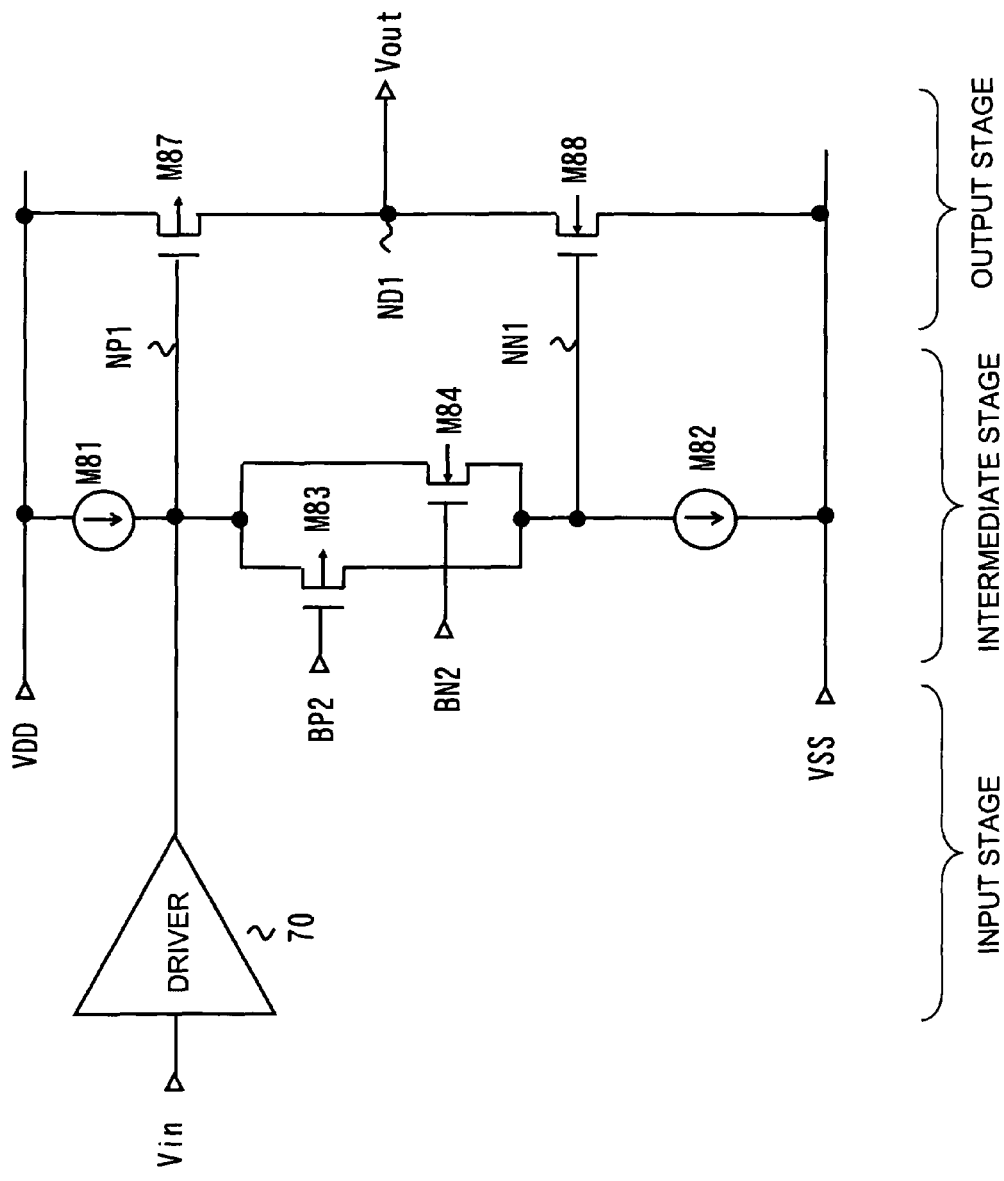
FIG. 10 is a diagram showing a configuration of a positive-polarity amplifier (with an output stage of the CMOS configuration) of a related art.

For the current-to-voltage converter circuit 20, a configuration with small idling current is employed. Specifically, an output circuit in FIG. 10 may be used as a differential stage and an intermediate stage.

As described above, in the differential amplifier in this exemplary embodiment, the gate of the P-channel transistor M18 in the output stage is connected to a connection node of the P-channel transistor M15 and the N-channel transistor M16. The size of the N-channel transistor M16 is set to be sufficiently small, and a drain current I2 of the N-channel transistor M16 is set to a fine current. Then, the gates of the P-channel transistor M15 and the N-channel transistor M16 in the intermediate stage are connected to the current-to-voltage converter circuit 20 that outputs the voltage signals Vf1 and Vf2 which change in the same direction between the first power supply potential and a second power second power supply potential according to the output current signals of the N-channel differential pair (M11, M12).

Figure 2:
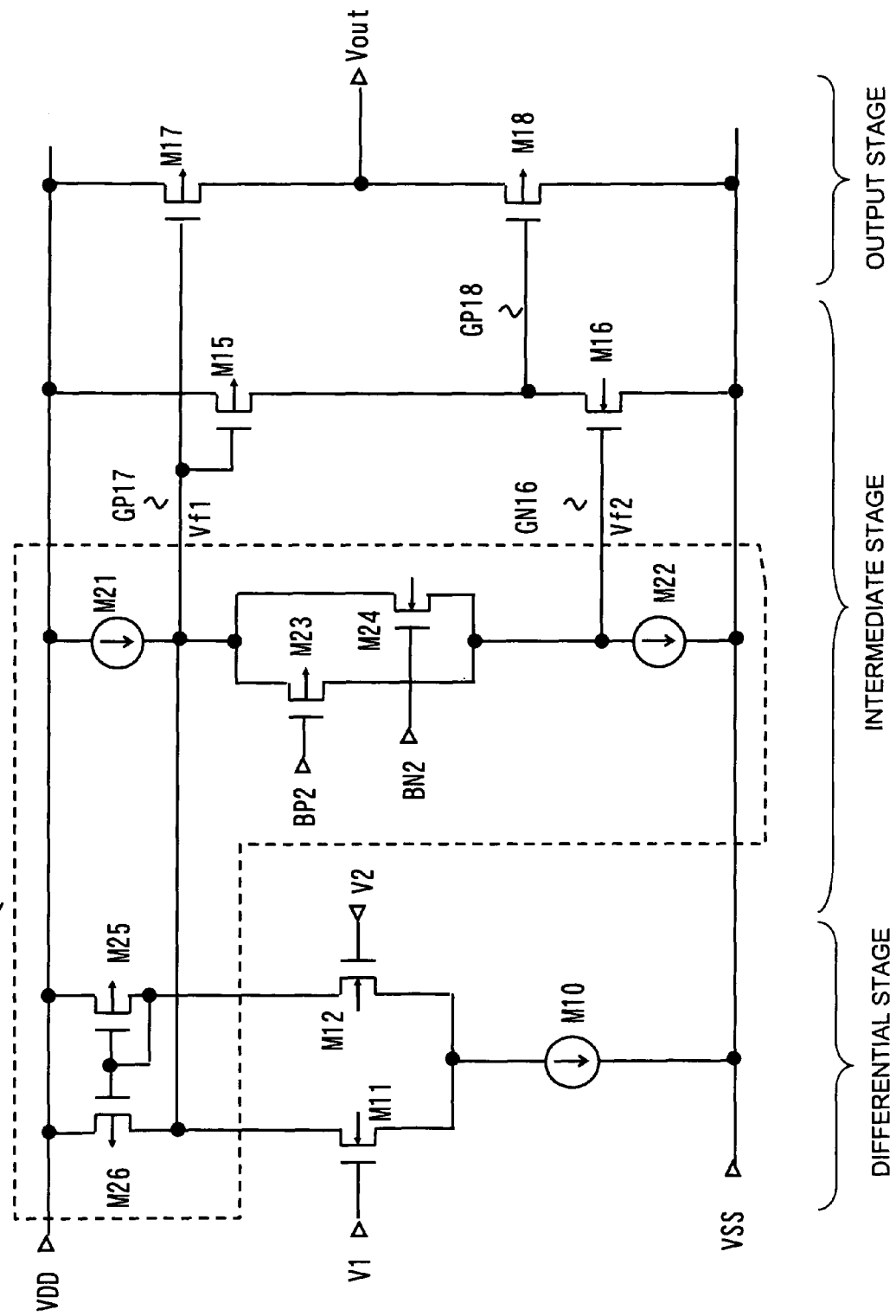
FIG. 2 is a diagram showing a configuration of a first exemplary embodiment of the present invention.

FIG. 2 is a diagram showing an example of a configuration of the current-to-voltage converter circuit 20 in FIG. 1. Referring to FIG. 2, the current-to-voltage converter circuit 20 comprises a current mirror circuit including PMOS transistors M25 and M26 that constitute active loads for the differential pair of the NMOS transistors M11 and M12, a P-channel floating current source M23, an N-channel floating current source M24, and current sources M21 and M22.

The P-channel floating current source M23 is formed of a PMOS transistor which has a source connected to a common gate node GP17 of PMOS transistors M15 and M17, a drain connected to a gate node GN16 of a NMOS transistor M16 and a gate supplied with a bias voltage BP2.

The N-channel floating current source M24 is formed of an NMOS transistor which has a drain connected to the common gate node GP17 of the PMOS transistors M15 and M17, a source connected to the gate node GN16 of the NMOS transistor M16 and a gate supplied with a bias voltage BN2.

The current source M21 is connected between the second power supply terminal (VDD) and the gate node GP17 of the P-channel transistor M17, and the current source M22 is connected between the first power supply terminal (VSS) and the gate node GN16 of the N-channel transistor M16. A sum of currents of the floating current sources M23 and M24 is set to be substantially equal to that of each of the current sources M21 and M22.

Figure 3:
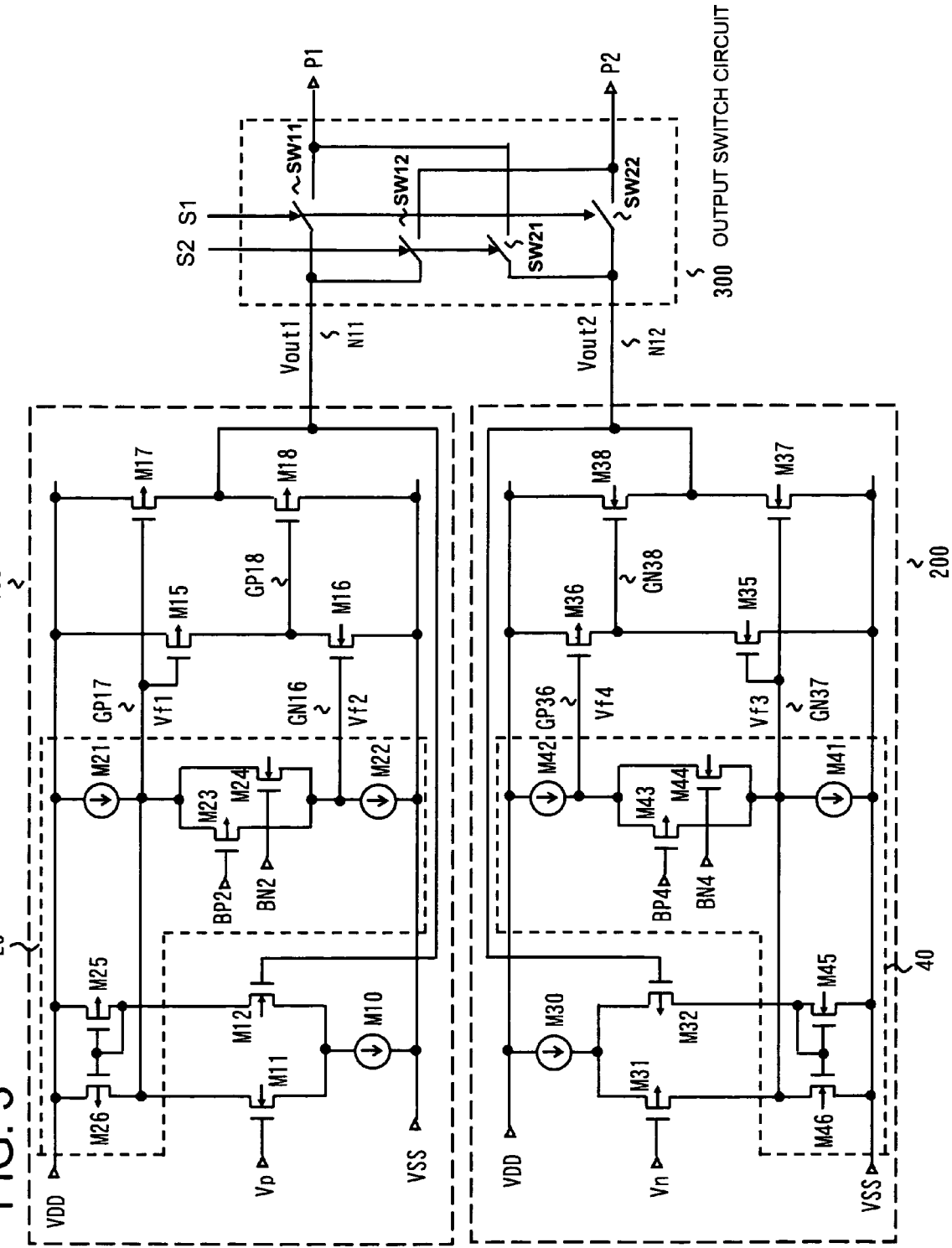
FIG. 3 is a diagram showing a configuration of a second exemplary embodiment of the present invention.

FIG. 3 is a diagram showing a configuration including a positive-polarity output buffer amplifier 100 shown in FIG. 2, a negative-polarity output buffer amplifier 200, and an output switch circuit 300. Referring to FIG. 3, the positive-polarity output buffer amplifier 100 has the configuration shown in FIG. 2. A positive-polarity signal voltage Vp is supplied to a gate (non-inverting input terminal) of an NMOS transistor M11 of an N-channel differential pair (M11, M12), and an output voltage (Vout1) is fed back to a gate (inverting input terminal) of the NMOS transistor M12, thereby forming a voltage follower configuration. The output switch circuit 300 has the same configuration as that shown in FIG. 7. Thus, a description of the output switch circuit 300 will be omitted.

The negative-polarity output buffer amplifier 200 can be configured in a similar manner by changing the conductivity type of the differential pair M11 and M12 of the positive-polarity output buffer amplifier 100 from N channel to P channel, and forming the current mirror using N-channel transistors.

As an intermediate stage, a current-to-voltage converter circuit 40, and an NMOS transistor M35 and a PMOS transistor M36 that respectively receive a first voltage output Vf3 and a second voltage output Vf4 at gates thereof (GN37, GP36) are included. The NMOS transistor M35 and the PMOS transistor M36 are connected between a power supply terminal (VDD) and a power supply terminal (VSS).

An output stage includes an NMOS transistor M38 which has a drain connected to the power supply terminal (VDD), a gate (GN38) connected to a drain of the PMOS transistor M36, and a source connected to an output terminal, and an NMOS transistor M37 which has a drain connected to the output terminal, a gate (GP37) connected to a gate of the transistor M35, and a source connected to the power supply terminal (VSS).

The current-to-voltage converter circuit 40 includes a current mirror circuit formed of NMOS transistors M45 and M46 that constitute active loads for a PMOS differential pair M31 and M32. The current-to-voltage converter circuit 40 further includes a P-channel floating current source M43 and an N-channel floating current source M44, and current sources M41 and M42.

The P-channel floating current source M43 is formed of a PMOS transistor which has a drain connected to the gate node GN37 of the transistor M37, a source thereof connected to the gate node GP36 of the transistor M36 and a gate supplied with a bias voltage BP4.

The N-channel floating current source M44 is formed of an NMOS transistor which has a source connected to the gate node GN37 of the NMOS transistor M37, a drain connected to the gate node GP36 of the PMOS transistor M36, and a gate supplied with a bias voltage BN4.

The current source M41 is connected between the first power supply terminal (VSS) and the gate node GN37 of the N-channel transistor M37. The current source M42 is connected between the second power supply terminal (VDD) and the gate node GP36 of the P-channel transistor M36. A sum of currents of the floating current sources M43 and M44 is set to be substantially equal to that of each of the current sources M41 and M42. A negative-polarity signal voltage Vn is supplied to a gate (non-inverting input terminal) of the transistor M31 of the P-channel differential pair (M31, M32). An output voltage (Vout2) is fed back to a gate (inverting input terminal) of the transistor M32, thereby forming a voltage follower configuration.

Figure 4A:
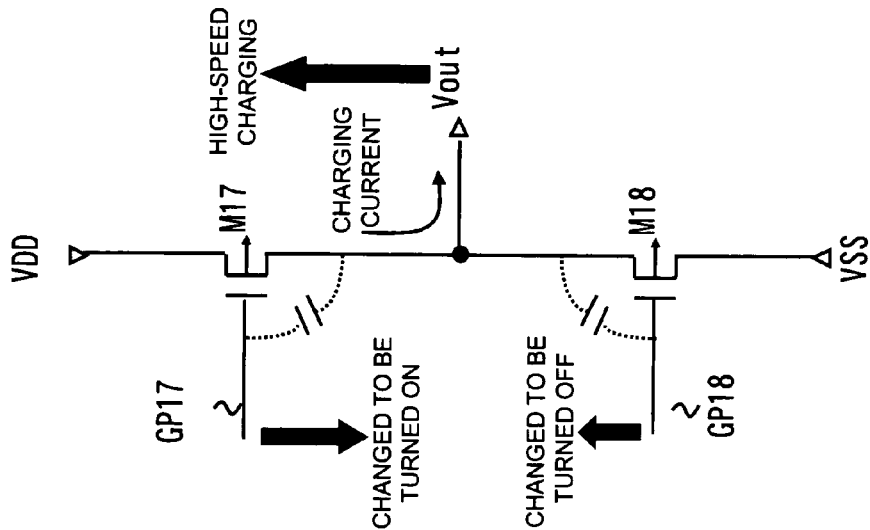

Next, an operation of an output stage of the positive-polarity output buffer amplifier in this exemplary embodiment at a time of charging at high speed will be described, with reference to FIGS. 4A and 4B. FIG. 4A shows a comparative example, and FIG. 4B is a diagram explaining an operation principle of the output stage in this exemplary embodiment.

FIG. 4A shows a case where both of charging and discharging elements in the output stage are set to be of a CMOS configuration (of transistors M87 and M88 in FIG. 10, for example) rather than P-channel MOS transistors, as the comparative example. When an output Vout is changed to a High level at high speed, a potential at a gate of the N-channel transistor M88 is raised through the gate-to-drain capacitance coupling. When the increase in the potential exceeds reduction of the potential at the gate of the N-channel transistor M88, a gate-to-source voltage of the N-channel transistor M88 is increased. The N-channel transistor M88 is thereby turned on, so that a short circuit current flowing from VDD to VSS through transistors M87 and M88 is generated. The magnitude (current value) of the short circuit current depends on the configuration, slew rate, a potential difference in the change of the output Vout, and the size of the transistor M88 in the output stage. When a large capacitive load is driven with a high slew rate, channel width sizes of the transistors M87 and M88 in the output stage are increased. Thus, gate-to-drain capacitances of the transistors M87 and M88 are increased, so that the short circuit current is increased at a time of charging at high speed.

Figure 4B:
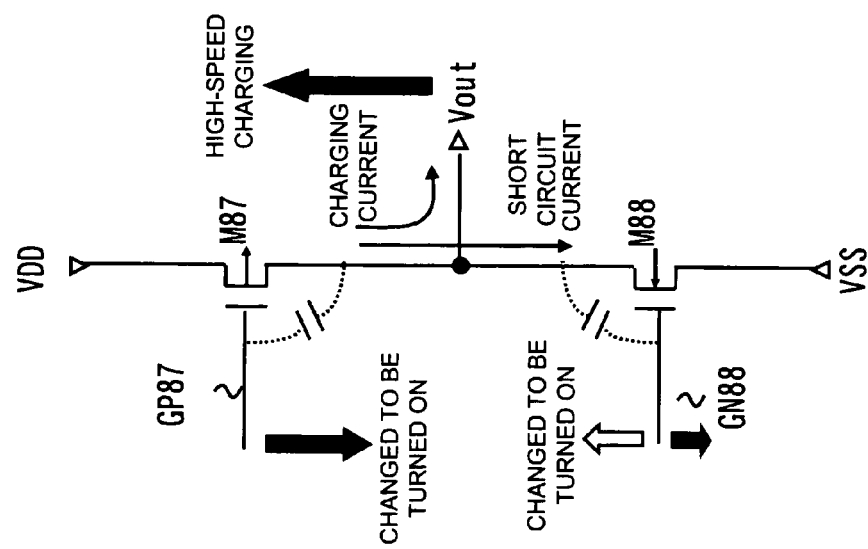

FIG. 4B shows a case where the output stage is formed of the (PMOS) transistors of the same conductivity type (in FIG. 1 and in the exemplary embodiment in FIG. 2). Since a large capacitive load is driven with a high slew rate as in FIG. 4A, channel widths of the P-channel transistors M17 and M18 are set to be sufficiently large. Assume that an output Vout is changed to a High level at high speed. Then, even if a potential at the gate of the P-channel transistor M18 is increased through the gate-to-source capacitance, the P-channel transistor M18 is turned off due to reduction of its gate-to-source voltage. Thus, no short circuit current is generated.

When the output Vout is changed to a Low level at high speed, a short circuit current is generated based on the same principle as in FIG. 4A. However, a potential difference in the change of the output Vout is small within a range of the same polarity. Thus, the short circuit current is also small.

Figure 5:
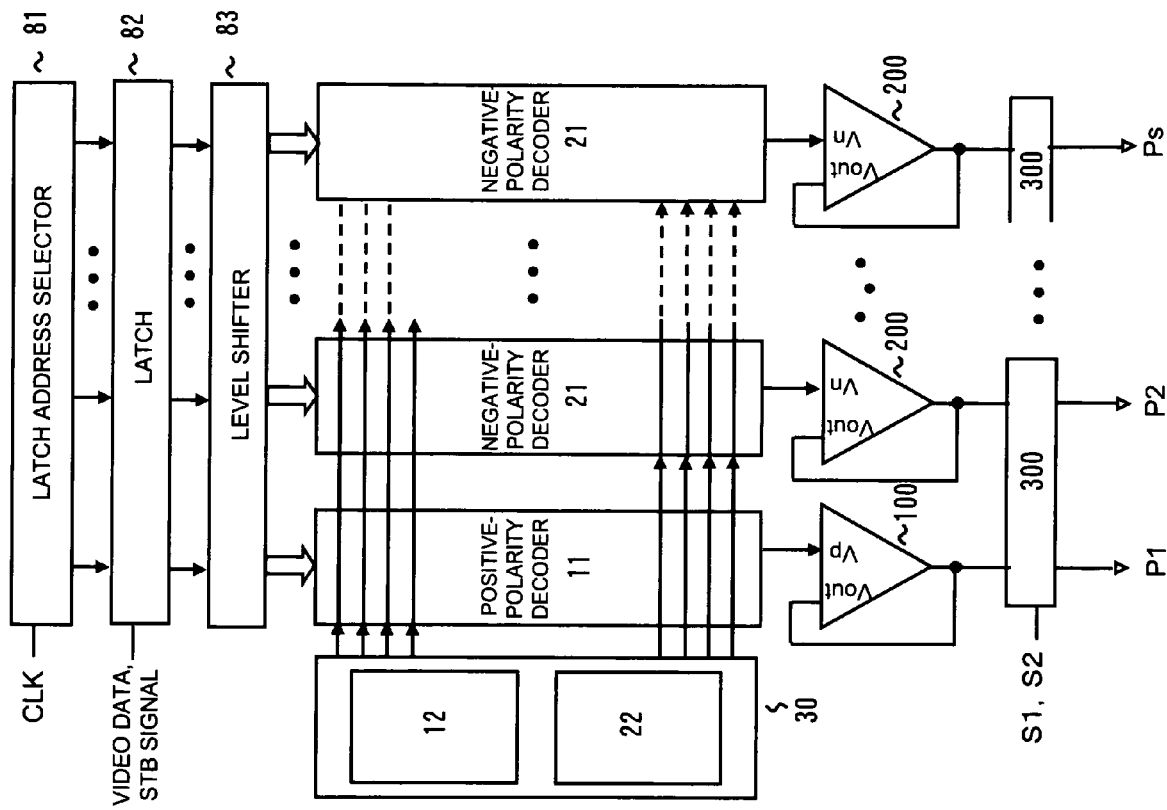
FIG. 5 is a diagram showing a configuration of a third exemplary embodiment of the present invention.

FIG. 5 is a diagram showing a configuration of a data driver for polarity inversion driving, which includes the output circuit shown in FIG. 3. FIG. 5 shows a main portion of the data driver in the form of blocks.

Referring to FIG. 5, this data driver includes a latch address selector 81, a latch 82, a level shifter 83, a reference voltage generation circuit 30, positive-polarity decoders 11, negative-polarity decoders 21, positive-polarity amplifiers 100, negative-polarity amplifiers 200, and output switch circuits 300. Each positive-polarity amplifier 100, each negative-polarity amplifier 200, and each output switch circuit 300 respectively correspond to the positive-polarity amplifier 100, negative-polarity amplifier 200, and output switch circuit 300 in FIG. 3.

The latch address selector 81 determines a data latch timing, based on a clock signal CLK. The latch 82 latches digital video data, based on the timing determined by the latch address selector 81, and outputs the data to the decoders (positive-polarity decoders 11 and negative-polarity decoders 21) through the level shifter 83 in unison, in response to an STB signal (strobe signal). The latch address selector 81 and the latch 82 are logic circuits, and are configured with a low voltage (0V to 3.3V), in general.

The reference voltage generation circuit 30 includes a positive-polarity reference voltage generation circuit 12 and a negative-polarity reference voltage generation circuit 22. To the positive-polarity decoders 11, reference voltages of the positive-polarity reference voltage generation circuit 12 are supplied. Each positive-polarity decoder 11 selects a reference voltage corresponding to input data, and outputs the selected reference voltage as a positive-polarity reference voltage Vp. To the negative-polarity decoders 21, reference voltages of the negative-polarity reference voltage generation circuit 22 are supplied. Each negative-polarity decoder 21 selects a reference voltage corresponding to input data, and outputs the selected reference voltage as a negative-polarity reference voltage Vn. Each positive-polarity amplifier 100 and each negative-polarity amplifier 200 receive the reference voltages Vp and Vn respectively output from the positive-polarity decoder 11 and the negative-polarity decoder 21, operate on and amplify the reference voltages Vp and Vn, respectively, and supplies output voltages to a corresponding one of the output switch circuits 300. The output switch circuits 300 are provided for every two terminals of the even-number of driver output terminals P1, P2, . . . , and Ps. According to control signals S1 and S2, each output switch circuit 300 switches and outputs the output voltages of the positive-polarity amplifier 100 and the negative-polarity amplifier 200 to the two terminals.

Figure 6:
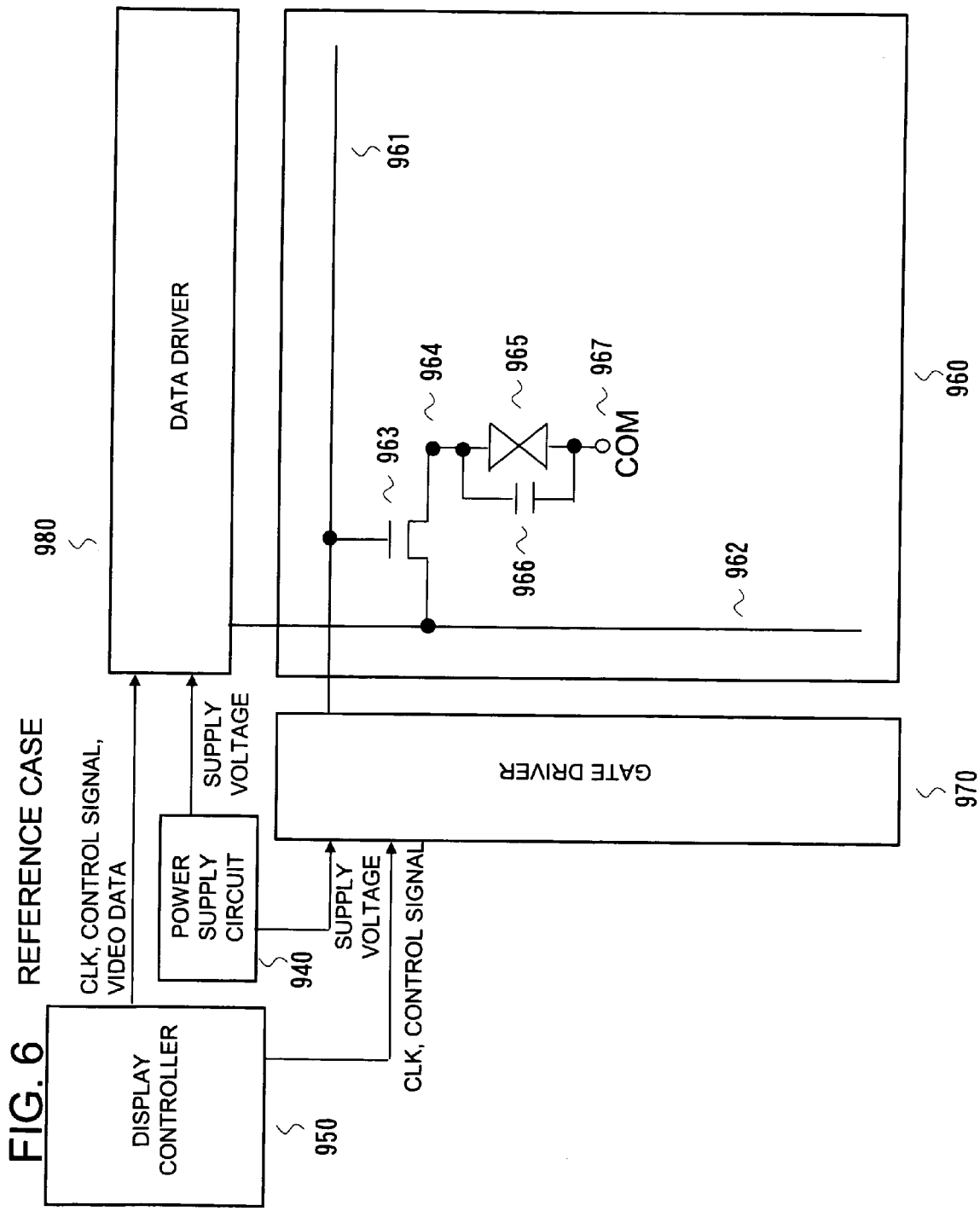
FIG. 6 is a diagram schematically showing a configuration of a liquid crystal display unit.

The data driver shown in FIG. 5 has the feature and effect of the data driver described with reference to FIGS. 1 through 3, so that low power dissipation and area saving (cost reduction) can be achieved. When the data driver in FIG. 5 is employed as a data driver 980 in a liquid crystal display device in FIG. 6, low power dissipation and cost reduction of the liquid crystal display device can be achieved.

Modifications and adjustments of examples or exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the basic technical concept.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
   a differential pair that differentially receives signals;

a current source connected between a first power supply terminal and the differential pair, the current source supplying current to the differential pair;

a current-to-voltage converter that responsive to an output current of the differential pair, produces first and second voltage signals;

a first transistor of a first conductivity type and a second transistor of a second conductivity type that are connected in series between the first power supply terminal and a second power supply terminal, the first and second transistors having control terminals supplied with the first and second voltage signals from the current-to-voltage converter circuit, respectively;

a third transistor of the first conductivity type connected between the second power supply terminal and an output terminal, the third transistor having a control terminal supplied with the first voltage signal from the current-to-voltage converter circuit; and a fourth transistor of the first conductivity type connected between the output terminal and the first power supply terminal, the fourth transistor having a control terminal connected to a connection node of the first and second transistors.

2. The differential amplifier according to claim 1, wherein the current-to-voltage converter circuit comprises:

a load circuit connected between an output pair of the differential pair and the second power supply terminal;

a second current source connected between the second power supply terminal and a connection node at which one output of the differential pair, the control terminal of the first transistor, and the control terminal of the third transistor are connected in common;

a third current source connected between the first power supply terminal and the control terminal of the second transistor; and fifth and sixth transistors of the first and second conductivity types that are connected in parallel between the control terminal of the first transistor and the control terminal of the second transistor, the fifth and sixth transistors having control terminals supplied with predetermined bias voltages, respectively;

the first voltage signal being a voltage signal at a connection node of the control terminal of the first transistor and the second current source, the second voltage signal being a voltage signal at a connection node of the control terminal of the second transistor and the third current source.

3. The differential amplifier according to claim 1, wherein the potentials of the first and second voltage signals produced by the current-to-voltage converter circuit change in the same direction between a first power supply potential and a second power second power supply potential.

4. A data driver comprising:

first and second buffer amplifiers that respectively receive positive-polarity and negative-polarity signals; and an output switch circuit that receives a first output of the first buffer amplifier and a second output of the second buffer amplifier, the output switch circuit performing switching so that the first and second outputs are respectively connected to first and second data lines, or the first and second outputs are respectively connected to the second and first data lines, based on switching control signals supplied thereto;

polarity inversion driving being performed for each N horizontal periods where N is an integer not less than two, each of the first and second buffer amplifiers comprising the differential amplifier as set forth in claim 3, the first and second conductivity types of the differential amplifier comprised by the first buffer amplifier being P and N types, respectively, the first and second conductivity types of the differential amplifier comprised by the second buffer amplifier being the N and P types, respectively, the first and second power supply terminals of the differential amplifier comprised by the second buffer amplifier corresponding to the second and first power supply terminals of the differential amplifier comprised by the first buffer amplifier, respectively.

5. A display device including a plurality of data drivers as set forth in claim 4.

6. A data driver of a display device including the differential amplifier as set forth in claim 1.

7. A display device including a plurality of data drivers as set forth in claim 6.

8. A data driver comprising:

first and second buffer amplifiers that respectively receive positive-polarity and negative-polarity signals; and an output switch circuit that receives a first output of the first buffer amplifier and a second output of the second buffer amplifier, the output switch circuit performing switching so that the first and second outputs are respectively connected to first and second data lines, or the first and second outputs are respectively connected to the second and first data lines, based on switching control signals supplied thereto;

polarity inversion driving being performed for each N horizontal periods where N is an integer not less than two, each of the first and second buffer amplifiers comprising the differential amplifier as set forth in claim 1, the first and second conductivity types in the differential amplifier comprised by the first buffer amplifier being P and N types, respectively, the first and second conductivity types in the differential amplifier comprised by the second buffer amplifier being the N and P types, respectively, the first and second power supply terminals in the differential amplifier comprised by the second buffer amplifier corresponding to the second and first power supply terminals in the differential amplifier comprised by the first buffer amplifier, respectively.

9. A display device including a plurality of data drivers as set forth in claim 8.

10. A differential amplifier comprising:

a differential pair including first and second transistors having first terminals commonly coupled and having control terminals for differentially receiving signals;

a first current source having one end connected to a first power supply terminal and the other end connected to the commonly coupled first terminals of the first and second transistors;

third and fourth transistors that are connected between second terminals of the first and second transistors and a second power supply terminal, the third and fourth transistors forming a current mirror;

a second current source having one end connected to the second power supply terminal;

a third current source having one end connected to the first power supply terminal;

fifth and sixth transistors, a first terminal of the fifth transistor and a second terminal of the sixth transistor being connected in common to the other end of the second current source, a second terminal of the fifth transistor and a first terminal of the sixth transistor being connected in common to the other end of the third current source, the fifth and sixth transistors having control terminals supplied with predetermined bias voltages, respectively;

a seventh transistor having a first terminal connected to the second power supply terminal;

an eighth transistor having a first terminal connected to the first power supply terminal and a second terminal connected to a second terminal of the seventh transistor;

a ninth transistor connected between the second power supply terminal and an output terminal; and a tenth transistor connected between the output terminal and the first power supply terminal;

a control terminal of the seventh transistor being connected to a common connection node at which a connection node of the first transistor and the third transistor, a connection node of the other end of the second current source and the fifth and the sixth transistors, and a control terminal of the ninth transistor are connected in common, a control terminal of the eighth transistor being connected to a connection node of the other end of the third current source and the fifth and the sixth transistors, a control terminal of the tenth transistor being connected to a connection node of the seventh and eighth transistors, the first and second transistors, the sixth transistor, and the eighth transistor being of a second conductivity type, and the third and fourth transistors, the fifth transistor, the seventh transistor, and the ninth and tenth transistors being of a first conductivity type.

11. A data driver of a display device including the differential amplifier as set forth in claim 10.

12. A display device including a plurality of data drivers as set forth in claim 11.

* * * * *